(12) United States Patent
Ha et al.

(10) Patent No.: US 11,498,204 B2
(45) Date of Patent: Nov. 15, 2022

(54) ROBOT

(71) Applicant: LG ELECTRONICS INC., Seoul (KR)

(72) Inventors: Jiwoo Ha, Seoul (KR); Hyunsup Song, Seoul (KR); Jaehun Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 699 days.

(21) Appl. No.: 16/503,811

(22) Filed: Jul. 5, 2019

(65) Prior Publication Data

US 2020/0023513 A1 Jan. 23, 2020

(30) Foreign Application Priority Data

Jul. 23, 2018 (KR) .......................... 10-2018-0085641

(51) Int. Cl.
*B25J 5/00* (2006.01)
*B25J 9/00* (2006.01)
*H05K 7/20* (2006.01)

(52) U.S. Cl.
CPC ............. *B25J 9/0009* (2013.01); *B25J 5/007* (2013.01); *H05K 7/20172* (2013.01)

(58) Field of Classification Search
CPC ......... B25J 5/007; B25J 11/008; B25J 19/005
See application file for complete search history.

(56) References Cited

U.S. PATENT DOCUMENTS

2018/0104829 A1* 4/2018 Altman ................... B25J 9/162
2018/0178375 A1* 6/2018 Yang ....................... B25J 9/1694

FOREIGN PATENT DOCUMENTS

| JP | H07-156084 | 6/1995 |
| KR | 10-0955530 | 4/2010 |
| KR | 10-1193610 | 10/2012 |
| KR | 10-2015-0031770 | 3/2015 |
| KR | 10-2018-0074486 | 7/2018 |

OTHER PUBLICATIONS

Korean Office Action dated Jan. 8, 2020 issued in KR Application No. 10-2018-0085641.

* cited by examiner

*Primary Examiner* — Randell J Krug
(74) *Attorney, Agent, or Firm* — KED & Associates, LLP

(57) ABSTRACT

A robot includes a first horizontal frame including a wheel and a motor for driving; a second horizontal frame which is spaced above the first horizontal frame and on which the control box is seated; a third horizontal frame which is spaced above the second horizontal frame and on which a sensor for autonomous driving is disposed; and a plurality of vertical frames which are spaced apart from each other on an upper surface of the second horizontal frame and connect the second horizontal frame and the third horizontal frame, in which the control box is provided so as to be capable of being drawn out inside the second horizontal frame through between two neighboring vertical frames.

19 Claims, 11 Drawing Sheets

ROBOT

CROSS-REFERENCE TO RELATED APPLICATION

The present application claims priority to Korean Patent Application No. 10-2018-0085641, filed on Jul. 23, 2018, which is hereby incorporated by reference in its entirety.

BACKGROUND

1. Field

The present description relates to a robot, and more particularly to an internal structure of the robot.

2. Background

A robot may include various components that allow the robot to move autonomously and to perform various functions. For example, Korean Patent No. 10-1193610 (registered on Oct. 16, 2012) describes a traffic guidance intelligent robot capable of autonomous driving. The robot autonomously drives on a crosswalk while avoiding obstacles for traffic guidance instruction.

This and other types of robots may include a "control box" in which a plurality of electronic components are positioned. The control box is typically formed in a polyhedral shape (e.g., a box shape) to form a receiving space to receive various electronic components therein. Therefore, since a relatively large number of electronic components may be positioned in a common location of the control box, access to and maintenance of the electronic components positioned in the control box may be facilitated.

However, a size of the control box may be limited to minimize an overall size of the robot, but as a result, the temperature inside the control box and adjacent regions of the robot may be excessively high due to heat emitted from the electronic components concentrated within the control box. To address the heat from the components, a heat radiating body such as a heat sink may be installed inside the control box to remove some of the accumulated heat. However, installing the heat radiating body within the control box may increase manufacturing complexity and consume some of the limited space within the control box. Furthermore, the heat control generally improves as more or larger heat radiating bodies are installed, but installing a large number of heat radiating bodies within the control box may significantly consume the limited space within the control box and may limit access to at least some of the electronic components.

Furthermore, an internal structure of a robot tends to be relatively complicated due to numerous wires or other electronic components positioned around or connected to the control box. Thus, access to the control box within the robot may be relatively difficult, and other components outside of the control box may be damaged when a technician attempts to access the controller box to access or/and replace any faulty electronic components.

In addition, when a robot is positioned outdoors, the robot may be exposed to ambient moisture, such as rain or water vapor in the air, and this moisture may be introduced within the robot. The moisture may enter the control box, thereby potentially damaging the components contained therein. Sealing the control box may deter moisture from entering the control box, but sealing the control box may prevent heat from exiting the control box.

The above-identified reference is incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Reference will now be made in detail to the embodiments of the present disclosure, examples of which are illustrated in the accompanying drawings.

In the following detailed description of the preferred embodiments, reference is made to the accompanying drawings that form a part hereof, and in which is illustrated by way of illustration specific preferred embodiments in which the description may be practiced. These embodiments are described in sufficient detail to enable those skilled in the art to practice the description, and it is understood that other embodiments may be utilized and that logical structural, mechanical, electrical, and chemical changes may be made without departing from the spirit or scope of the description. To avoid detail not necessary to enable those skilled in the art to practice the description, the description may omit certain information known to those skilled in the art. The following detailed description is, therefore, not to be taken in a limiting sense.

Also, in the description of embodiments, terms such as first, second, A, B, (a), (b) or the like may be used herein when describing components of the present description. Each of these terminologies is not used to define an essence, order or sequence of a corresponding component but used merely to distinguish the corresponding component from other component(s). It should be noted that if it is described in the specification that one component is "connected," "coupled" or "joined" to another component, the former may be directly "connected," "coupled," and "joined" to the latter or "connected", "coupled", and "joined" to the latter via another component.

In this specification, as an example, an embodiment in which the guide robot is applied to an airport will be described. However, it can be seen that the guide robot according to the present description can be applied not only to airports but also throughout social facilities such as large shopping facilities, cultural facilities or public facilities.

Figure 1:
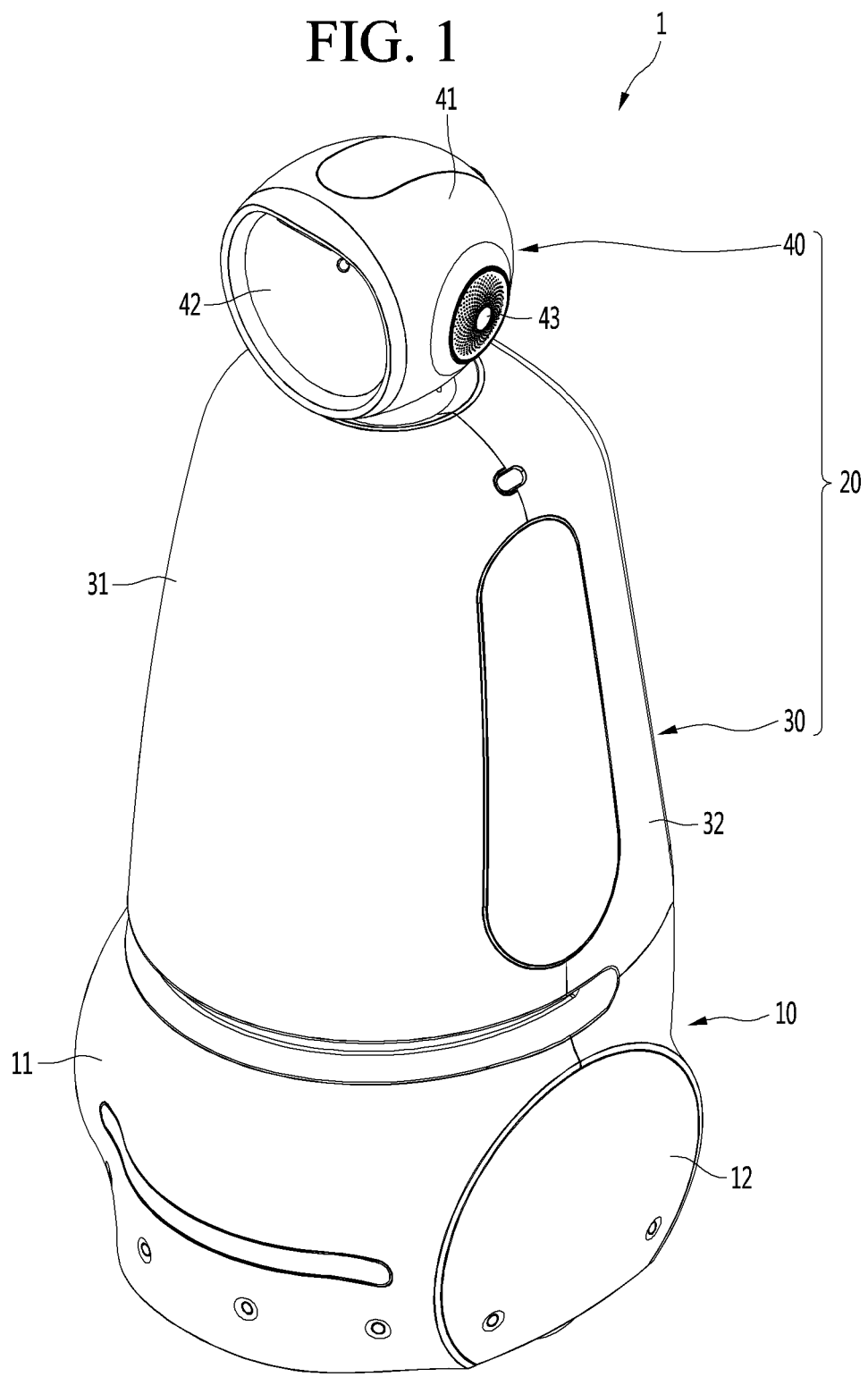
FIG. 1 is a front perspective view illustrating an outer appearance of a guide robot according to an embodiment of the present description.
Figure 2:
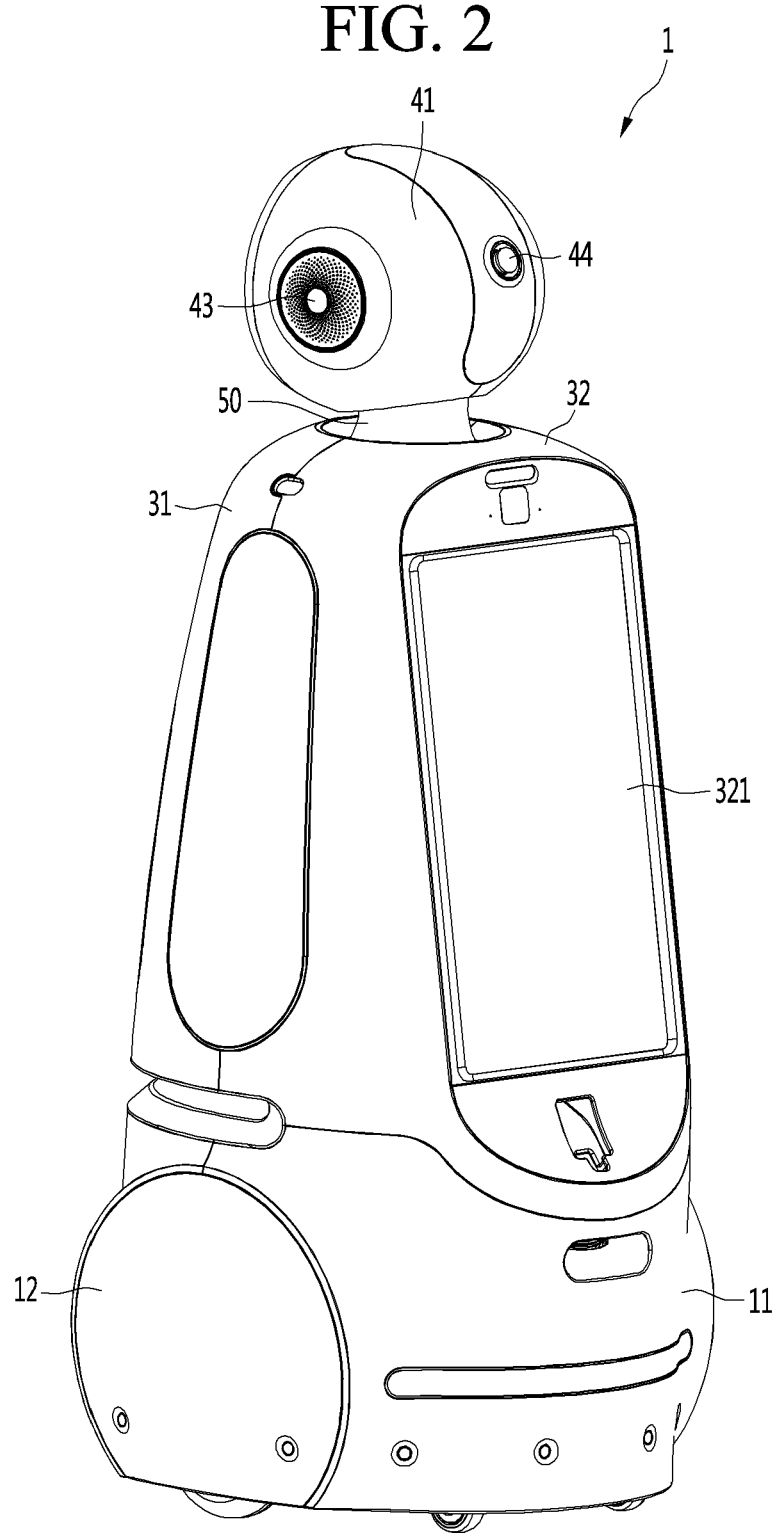
FIG. 2 is a rear perspective view illustrating an outer appearance of a guide robot according to an embodiment of the present description.
Figure 3:
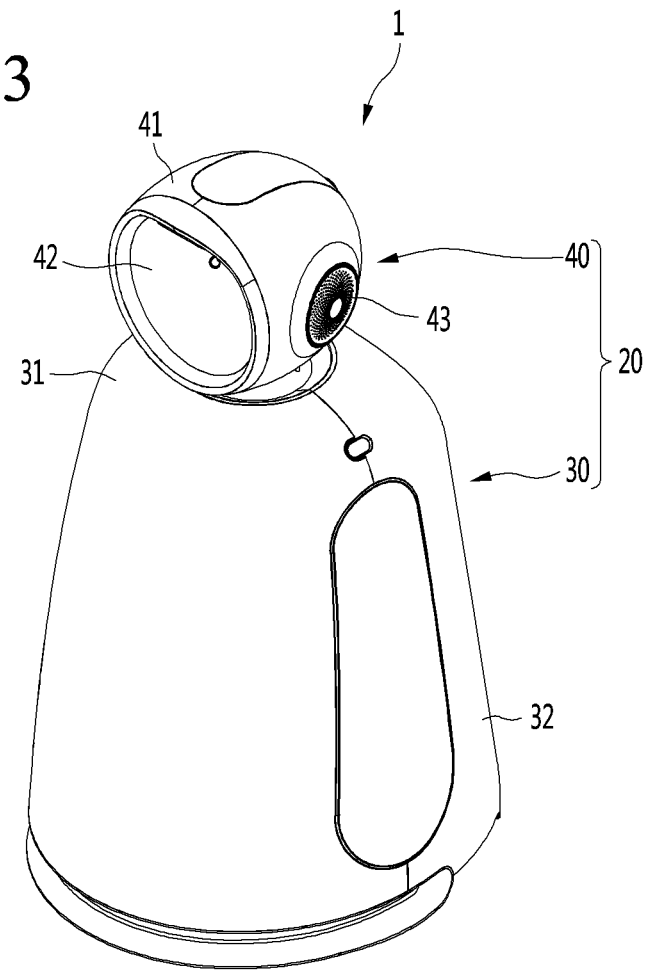
FIG. 3 is a view illustrating a state where the guide robot is divided into a lower module and an upper module according to an embodiment of the present description.
Figure 3:
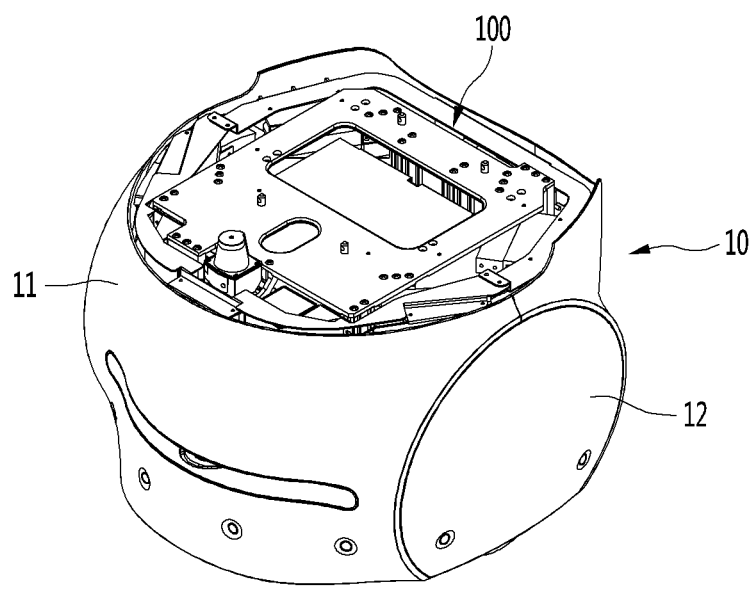

FIG. 1 is a front perspective view illustrating an outer appearance of a guide robot 1 according to an embodiment of the present description, FIG. 2 is a rear perspective view illustrating an outer appearance of a guide robot 1 according to an embodiment of the present description, and FIG. 3 is a view illustrating a state where the guide robot 1 is divided into a lower module and an upper module according to an embodiment of the present description. While certain aspects discussed in the present description are presented with respect to the guide robot 1, it should be appreciated that these aspects may also be applicable to a robot that does not perform a guide function (such as a robot the performs a cleaning function and/or automated movement), and the guide robot 1 may also be referred to as robot 1.

Referring to FIGS. 1 to 3, the guiding robot 1 according to the embodiment of the present description may include a lower module 10 and an upper module 20 coupled to the upper portion of the lower module 10. In certain implementations, the lower module 10 may include or otherwise house a plurality of components for autonomous driving, and the upper module 20 may include or otherwise house a plurality of components for performing a guidance function related to providing directions and airport information to the user and/or one or more other functions.

In detail, the lower module 10 may support the upper module 20 and may be in direct contact with a ground surface to be capable of being driven to cause the robot 1 to travel along the ground surface. The lower module 10 can drive in one direction or another direction according to a predetermined driving route and can rotate to change the traveling direction (e.g., to rotate up to 360 degrees).

The lower module 10 includes a driving unit 100 having various components for driving a movement of the robot 1 and a lower case 11 and a wheel case 12 for shielding the exterior of the driving unit 100. In one implementation, the driving unit 100 includes a wheel (e.g., wheel 116 in FIG. 4) that rotates to move the robot 1 based on receiving a driving force, a driving motor (e.g., motor 118 in FIG. 7) that provides the driving force, a plurality of sensors, a battery, and a control box. Components such as the driving wheel, the driving motor, the rider sensor, the battery, and the control box can be covered by the lower case 11 and the wheel case 12. Accordingly, since the inner components of the driving unit 100 can be shielded by the lower case 11 and the wheel case 12, the inner components of the driving unit 100 can be protected and the outer appearance of the robot 1 can be aesthetically simple.

The upper module 20 may be installed at an upper portion of the lower module 10 and may function to provide various services at the user's eye level. For example, the upper module 20 includes a body portion 30 provided above the lower module 10, and a head portion 40 provided above the body portion 30. In certain implementations, the head portion 40 may be rotatable, such as to rotate to face a user, to face a movement direction, and/or to orient a sensor in desired direction.

In certain implementations, the body portion 30 is formed to have a long length in the vertical direction and may have a roly-poly or conical pyramid shape which becomes slimmer as the body portion 30 extends up from the lower portion (e.g., near the lower module 10) to the upper portion (e.g., near the head portion 40). The horizontal sectional area of the body portion 30 may be smaller than the horizontal cross-sectional area of the lower module 10, and the horizontal cross-sectional area of the body portion 30 is stably supported on an upper side or surface of the lower module 10. In another example, the robot 1 may have a different shape, such a substantially cylinder shape in which the lower module 10 and the body portion 30 have similar horizontal cross-sectional areas, of an inverted pyramid in which the horizontal cross-sectional areas the lower module 10 and the body portion 30 increase as the robot extends upwards from the ground travel surface.

In addition, the body portion 30 may be detachably coupled to the lower module 10. For example, the lower portion of the body portion 30 may be in contact and coupled with the upper portion of the lower module 10, and in some cases, the lower portion of the body portion 30 can be used when separated from the upper portion of the lower module 10. For example, the user may remove and use the body portion 30 (e.g., to view a display device or user input device mounted to the body portion 30) while the lower module 10 continues to move in a desired travel pattern. In this case, the lower module 10 may be used to carry a load, an object, or etc. on its upper surface.

Alternatively, the upper module 20 supporting other services may be alternatively coupled to the upper side of the lower module 10. In this case, the guide robot 1 can provide services corresponding to not only the airport but also other facilities. Since a common lower module 10 can be used to provide movement functions, and the upper module 20 can be changed to provide another service, there is an advantage that the lower module 10 can be shared between upper modules 20 providing different functions and services to reduce overall costs and manufacturing complexity.

The body portion 30 may include a body case which forms an outer appearance of the body portion 30. For example, the body case may include a front case 31 forming a front outer appearance of the body portion 30 and a rear case 32 forming a rear outer appearance of the body portion 30. As used herein, "front" may be used to describe a primary movement direction of the robot 1 and "rear" may be used to describe a different direction that is opposite to the primary movement direction.

The front case 31 and the rear case 32 cover the body portion 30 in a front and rear direction, and in some example, the front case 31 and the rear case 32 may be coupled to each other. Since the front case 31 and the rear case 32 are not integrally formed but are formed of two parts in certain examples, there is an advantage that the body portion 30 is easily assembled. Alternatively, the front case 31 and the rear case 32 may be integrally formed. In another example, the front case 31 and the rear case 32 may be separated by an intermediate case (not shown) provided at a side of the robot 1.

In addition, the body portion 30 may further include a display unit 321. The display unit 321 may function to provide various kinds of visual information to the user. For example, in a case where the display unit 321 provides airport-related information, the display unit 321 may present airport gate query information, directions service information, a ticketing related service, or similar information.

The display unit 321 is installed on one side of the body case. For example, the display unit 321 may be installed in the rear case 32. In other words, the display unit 321 may be disposed toward the rear of the guide robot 1 such that the display unit 321 is positioned to be viewed by a user behind the moving robot 1.

The reason why the display unit 321 is disposed behind the guide robot 1 is that when the guide robot 1 moves first along a route set, such as to guide a user to a destination, the display unit 321 installed behind the guide robot 1 can be seen while the user is moving to follow the guide robot 1. Thus, even if the guide robot 1 is driving to move to a destination, the user can easily see the information displayed on the display unit 321 while following the guide robot 1. Thus, the robot 1 can provide a guidance service in which the robot 1 can concurrently guide a following user to a destination while also viewing concurrently displaying directions to the destination such that the user can choose to stop following the robot 1 or the robot 1 can be diverted to aid another user, such as to provide an emergency response.

On the other hand, the head portion 40 is disposed on the upper side of the body portion 30. The head portion 40 may be connected to the upper-end portion of the body portion 30 and may be rotatably installed. The head portion 40 may be rotatable independently of the body portion 30 and may rotate at a predetermined angle in one direction (left direction) or another direction (right direction). In one example, the head portion 40 and the body portion 30 may be connected by a connection portion (or neck) 50.

The connection portion 50 has a lower end portion fixed to the inside of the upper-end portion of the body portion 30 and an upper-end portion capable of supporting the head portion 40. However, the head case 41, which forms the outer appearance of the head portion 40, may rotate independently of the connection portion 50. For example, the head case 41 may not be in contact with the connection portion 50 and may be spaced apart from each other at a predetermined interval. Therefore, the head portion 40 can be rotated when the connection portion 50 is stopped.

The head portion 40 may include an operation unit (or touchscreen) 42. The operation unit 42 may perform a function of receiving a command from a user and a function of displaying service information. For example, the operation unit 42 may include a touch monitor for receiving a touch input from a user. The touch monitor may include a touch panel configured to receive user input and a display for displaying output information. The operation unit 42 may have a circular or elliptical outer appearance as a whole and may be disposed on the front surface of the head case 41. In other examples, the operation unit 42 may include other types of input devices (e.g., a various buttons, a microphone, motion sensors, etc.) and/or other types of output devices (e.g., a speaker, braille display, printer, etc.). In certain examples, the operation unit 42 may include a communication interface (e.g., a wireless modem) to communication with a user device, such as a smart phone, and the operation unit 42 may receive input and/or output data via the user device. In another example, the operation unit 42 may include a communication interface (e.g., a wireless modem) to communication with an external device, such as a kiosk, sensor, display device, or other robot, and the operation unit 42 may receive input and/or output data via the external device.

Further, the head portion 40 may further include a speaker 43. The speaker 43 functions to output airport guidance information by voice or other audio content. At least one speaker 43 may be provided, and preferably two speakers 43 may be provided. For example, the speaker 43 may be spaced apart from each other and provided at opposite sides of the head case 41.

Further, the head portion 40 may further include an emergency operation button 44. The emergency operation button 44 serves to immediately stop the operation of the guide robot 1 while the guide robot 1 is stationary or while driving. For example, the emergency operation button 44 may be positioned behind the head case 41 so that the emergency operation button 44 can be easily operated even if the guide robot 1 is driven forward.

Various directions described herein may be defined as follows. With respect to FIG. 1, the direction in which the operation unit 42 faces may be defined as "a front direction". In addition, with respect to FIG. 2, the direction in which the display unit 321 faces may be defined as "a rear direction". For example, the front direction and the rear direction may be directions opposite to each other and may correspond to respective output directions by the operation unit 42 and the display unit 321.

Figure 4:
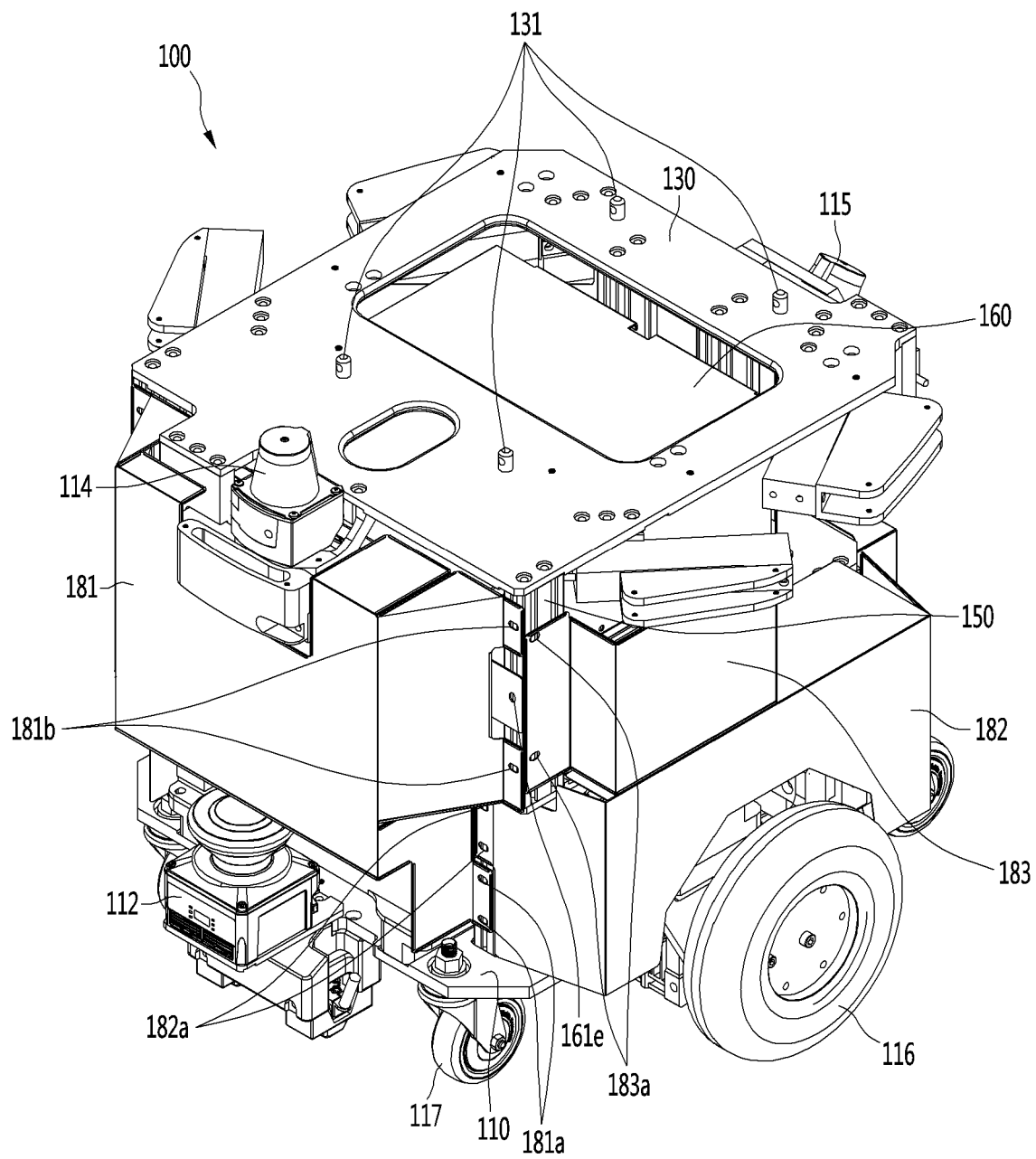
FIG. 4 is a front perspective view illustrating an outer appearance of a driving unit according to an embodiment of the present description.
Figure 5:
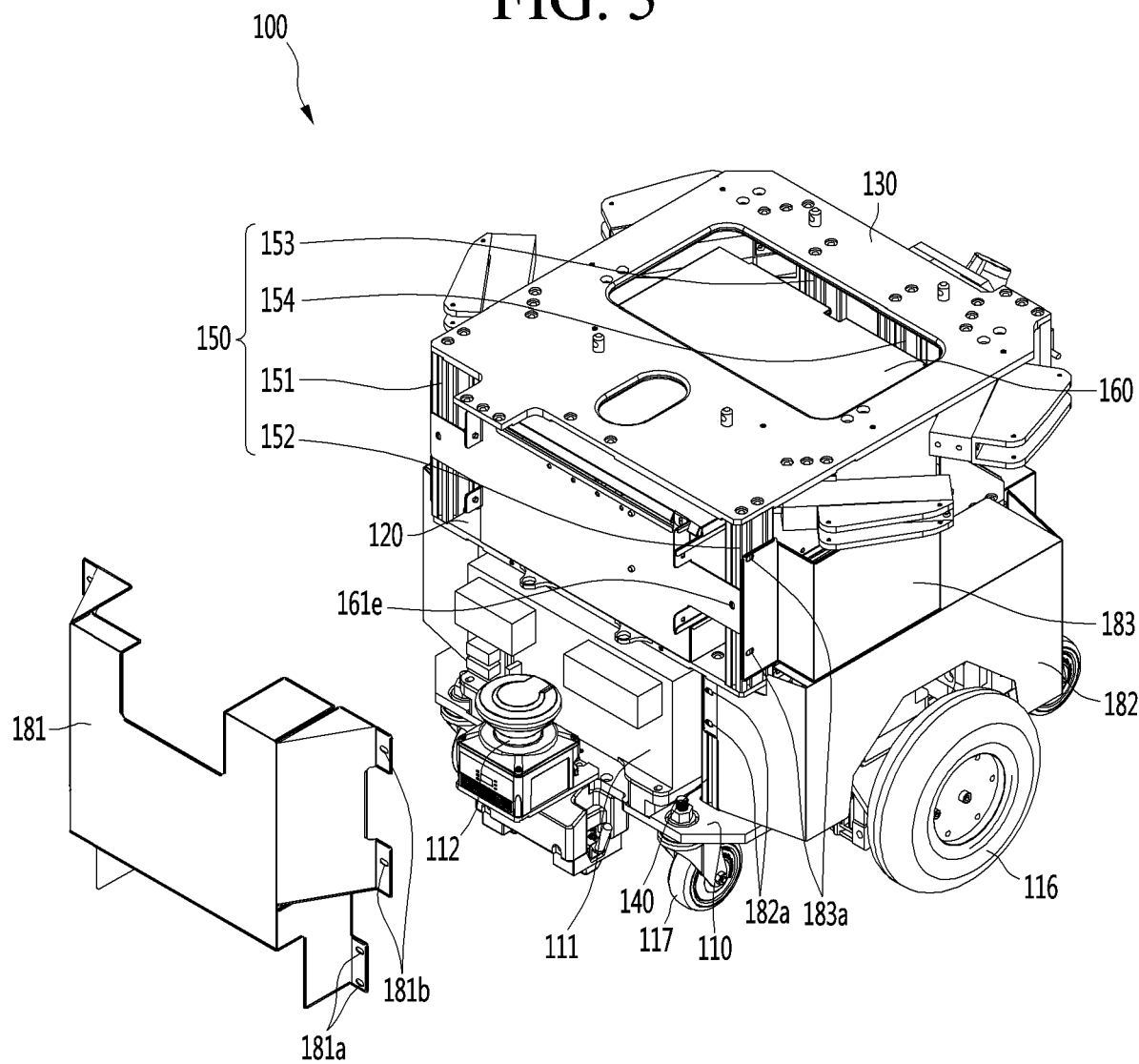
FIG. 5 is a view illustrating a state where the front cover is separated from the driving unit of FIG. 4.
Figure 6:
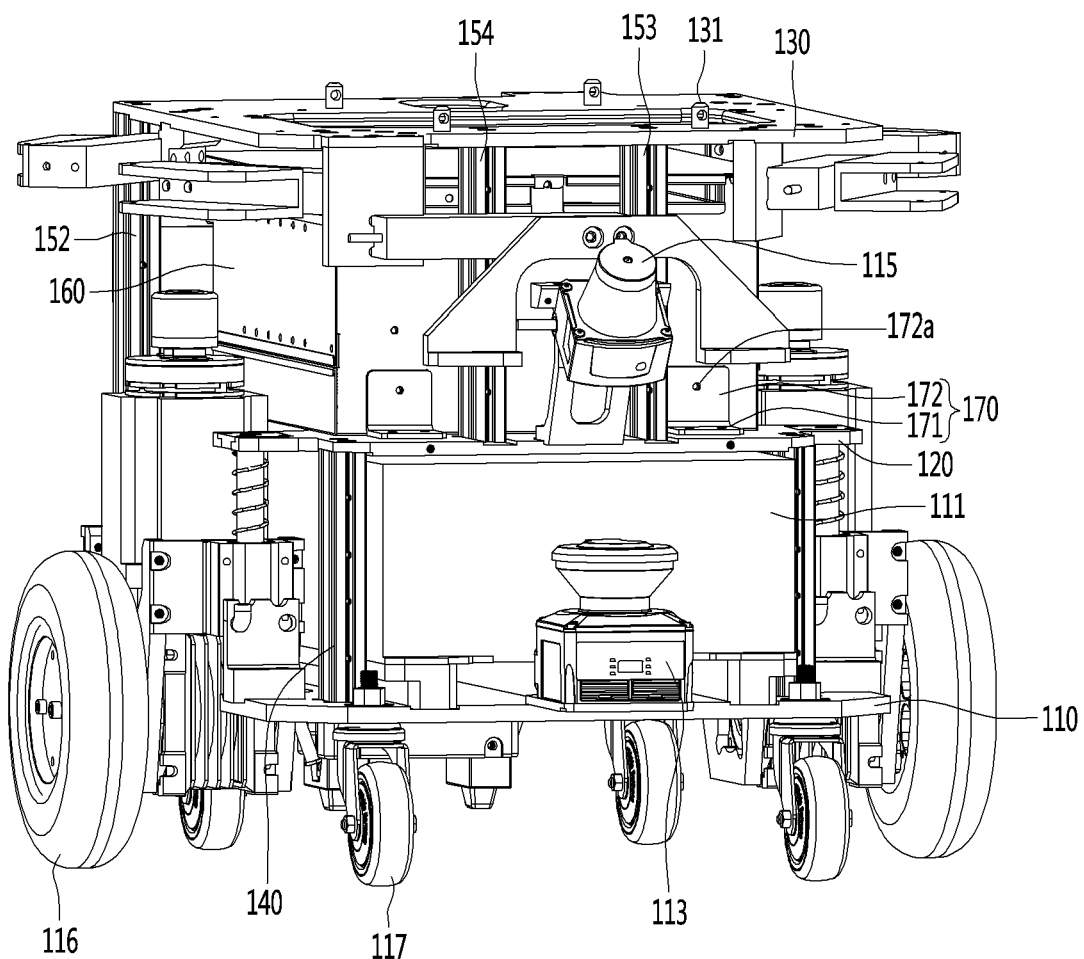
FIG. 6 is a rear perspective view illustrating an outer appearance of a driving unit according to an embodiment of the present description.
Figure 7:
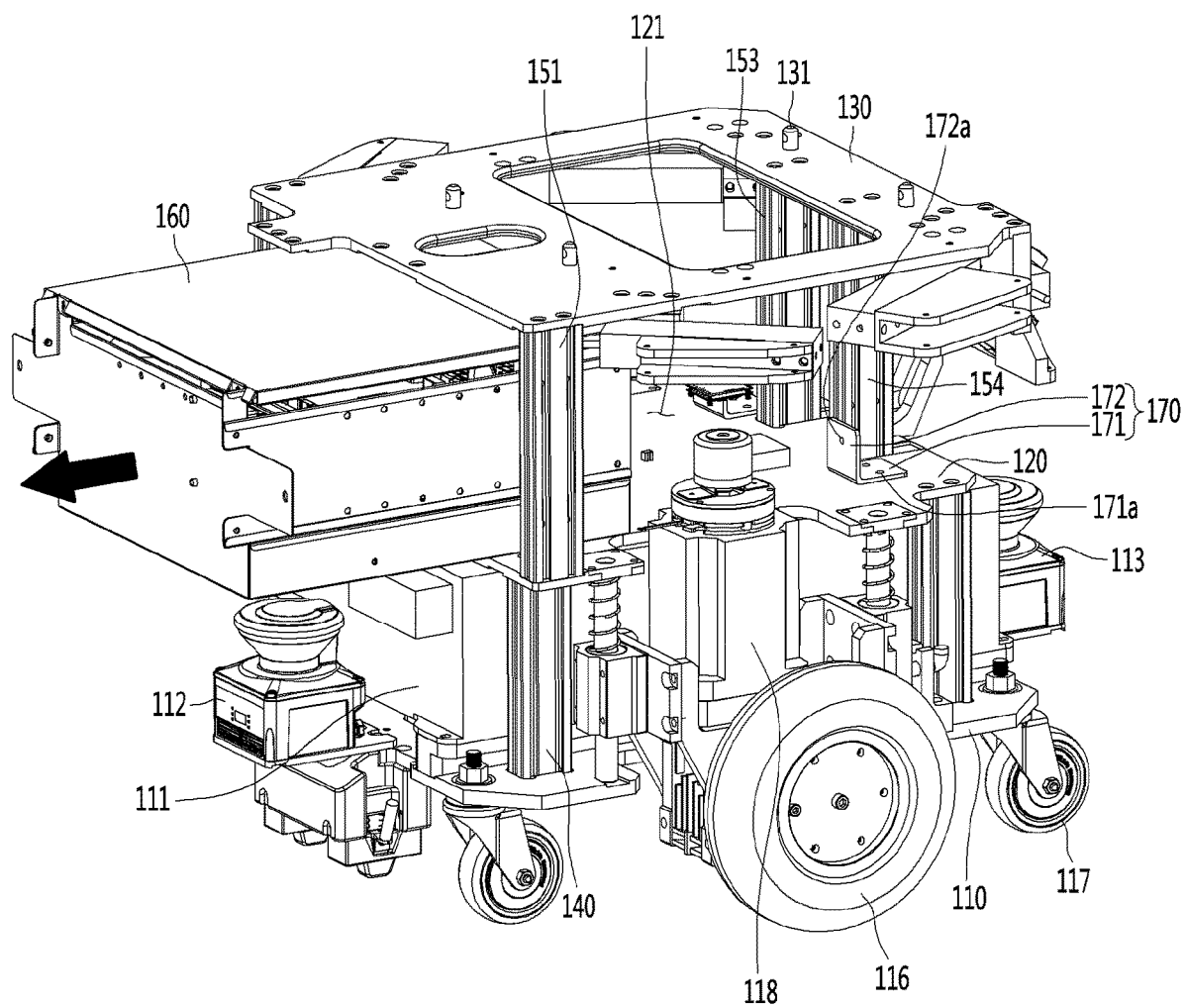
FIG. 7 is a view illustrating a state where a control box is separated from a driving unit according to an embodiment of the present description.

Hereinafter, a driving unit according to an embodiment of the present description will be described in detail with reference to the drawings. FIG. 4 is a front perspective view illustrating an outer appearance of a driving unit 100 according to an embodiment of the present description, FIG. 5 is a view illustrating a state where a front cover 181 is separated from the driving unit 100 of FIG. 4, FIG. 6 is a rear perspective view illustrating an outer appearance of a driving unit 100 according to an embodiment of the present description, and FIG. 7 is a view illustrating a state in which a control box 160 is separated from a driving unit according to an embodiment of the present description.

Referring to FIGS. 4 to 7, the driving unit 100 according to the embodiment of the present description includes a plurality of horizontal frames (or plates) 110, 120 and 130. The plurality of horizontal frames 110, 120 and 130 may be disposed so as to be spaced apart from each other in the vertical direction. The plurality of horizontal frames 110, 120 and 130 may be disposed to overlap in the vertical direction.

For example, the plurality of horizontal frames 110, 120 and 130 may include a first horizontal frame (also referred to as a first plate or base plate) 110 forming a bottom surface of the driving unit 110, a second horizontal frame (also referred to as a second plate or intermediate plate) 120 positioned above the first horizontal frame 110, and a third horizontal frame (also referred to as a third plate or upper plate) 130 positioned above the second horizontal frame 120.

Each of the first to third horizontal frames 110, 120, and 130 may have a substantially plate shape with a respective surface area. The first to third horizontal frames 110, 120, and 130 may be spaced apart from each other in the vertical direction to form a space in which the components are disposed. For example, a space formed between the first horizontal frame 110 and the second horizontal frame 120 can be defined as "a lower installation space" and a space defined between the second horizontal frame 120 and the third horizontal frame 130 can be defined as "an upper installation space 121".

In addition, the driving unit 100 may further include a plurality of vertical frames (or posts) 140 and 150. The plurality of vertical frames 140 and 150 may be provided between the plurality of horizontal frames 110, 120 and 130 to connect the plurality of horizontal frames 110, 120 and 130 to each other. For example, the vertical frames 140 and 150 may extend vertically between the horizontal frames 110, 120 and 130 to disperse and support the load applied to the horizontal frames 110, 120 and 130.

For example, the vertical frames 140 and 150 includes first vertical frames (or first posts) 140 connecting the first horizontal frame 110 and the second horizontal frame 120, and second vertical frames (or second posts) 150 connecting the second horizontal frame 120 and the third horizontal frame 120. Each of the first and second vertical frames 140 and 150 may have a bar shape that extends in the vertical direction.

A plurality of first and second vertical frames 140 and 150 can be provided. For example, the four first vertical frames 140 may be provided on the upper edge or lateral surface of the first horizontal frame 110, and the first vertical frames 140 may be spaced apart from each other along the upper edge of the first horizontal frame 110. Similarly, the four second vertical frames 150 may be formed on the upper edge of the second horizontal frame 120, and the second vertical frames 150 may be spaced apart from each other along the upper edge of the second horizontal frame 120. In the example shown in the drawings, the second vertical frame 150 may include a pair of front frames 151 and 152 spaced from each other at a front edge of the second horizontal frame 120 and a pair of rear frames 153 and 154 spaced apart from the rear edge of the second horizontal frame 120.

In one implementation, a spacing distance between the pair of the front frames 151 and 152 may differ from a spacing distance between the pair of the rear frames 153 and 154. For example, the spacing distance between the pair of front frames 151 and 152 may be larger than the spacing distance between the pair of rear frames 153 and 154. As described in greater detail below, a control box (also referred to herein as an inner housing or component housing) 160 can be drawn in and out of a space between the pair of front frames 151 and 152, while the control box 160 is prevented from extending backward by the pair of rear frames 153 and 154 due to the small spacing between the rear frames. While the control box 160 is described as a "box", it should be appreciated that control box 160 may have different shapes, such as to have one or more curved or angled surfaces. Furthermore, draw-in direction of the control box 160 may be guided by the pair of front frames 151 and 152.

Meanwhile, the third horizontal frame 130 is coupled to the upper-end portion of the second vertical frame 150. The third horizontal frame 130 may be positioned at the uppermost end of the driving unit 100 and may be detachably coupled to the upper module 20. For this detachable connection to the upper module 20, a connection guide (or connection boss) 131 for separating from and coupling with the upper module 20 may be formed in the third horizontal frame 130. For example, the connection guide 131 may protrude from the upper surface of the third horizontal frame 130 by a predetermined height. In other implementations, the connection guides 131 (or other device for connecting the upper module 20 to the lower module 10) may be coupled to an intermediate component provided above the third horizontal frame 130, such as another horizontal frame (not shown).

In one example, the plurality of connection guides 131 may be formed in the third horizontal frame 130 and may be inserted into guide holes (not illustrated) provided at a lower end portion of the upper module 20. For instance, the connection guide 131 may be inserted into a corresponding guide hole to be coupled to the upper module 20, and in some cases, the connection guide 131 may be detached from the guide hole and thus can be separated from the upper module 20.

In addition, the driving unit 100 may further include a battery 111. The battery 111 functions to supply power to the electronic components provided in the guide robot 1 and to supply power to the drive motor (e.g., motor 118 in FIG. 7) to be described later. The battery 111 may include a lithium (Li)-ion battery or other types of rechargeable battery. However, the present description is not limited thereto, and the battery 111 may include other types of batteries other than a Li-ion battery.

In one implementation, the battery 111 may be received in the lower installation space provided between the first horizontal frame 110 and the second horizontal frame 120. For example, the battery 111 may be positioned on the upper surface of the first horizontal frame 110. The battery 111 may be placed on the first horizontal frame 110 corresponding to the lowest point of the driving unit 100 because the weight of the battery 111 is relatively heavy compared to other components, and positioning the battery on the first horizontal frame 130 lowers the center of gravity for robot 1 to deter tipping.

In addition, the driving unit 100 may further include light detection and raging (LiDAR) sensors 112 and 113. The LiDARs 112 and 113 are laser radars and can be understood to be a sensor that irradiates a laser beam and then collects and analyzes backscattered light among the light absorbed or scattered by the aerosol to perform position recognition for the robot 1. The LiDARs 112 and 113 may include a LiDAR rider 112 and a LiDAR rider 113.

The front LiDAR 112 may be disposed on the front side of the first horizontal frame 110 and the rear LiDAR 113 may be disposed on the rear side of the first horizontal frame 110. For example, the front LiDAR 112 may be disposed at a portion extending forward from an edge of the first horizontal frame 11, and the rear LiDAR 113 may be disposed at a portion extending rearward from an edge of the first horizontal frame 110. Further, the front LiDAR 112 and the rear LiDAR 113 may be provided at positions corresponding to the same height.

In addition, the driving unit 100 may further include cliff sensors 114 and 115. The cliff sensors 114 and 115 may perform a function of sensing a step or drop of greater than a prescribed height on a driving surface on which the guide robot 1 moves. In conjunction with this, the guide robot 1 can perform stopping or avoidance maneuvers when detecting a cliff or detecting an obstacle during driving.

The cliff sensors 114 and 115 may include a front cliff sensor 114 and a rear cliff sensor 115. The front cliff sensor 114 may be provided on the front side of the third horizontal frame 130 and the rear cliff sensor 115 may be disposed on the rear side of the second horizontal frame 120.

For example, the front cliff sensor 114 may be installed at a portion extending forward from an edge of the third horizontal frame 130, and the rear cliff sensor 115 may be installed at a portion which extends from an edge of the second horizontal frame 120 or the third horizontal frame 130 to the rear. At this time, the front cliff sensor 114 may be disposed at a position higher than the rear cliff sensor 115.

Here, the LiDARs 112 and 113 and the cliff sensors 114 and 115 may be understood as sensors for autonomous driving of the guide robot 1. For example, at least one sensor for autonomous driving may be installed in each of the first to third horizontal frames 110, 120, and 130.

In addition, the driving unit 100 may further include a control box 160. The control box 160 has a configuration in which one or more electronic components, such as a central processor and/or control board, for the driving unit 100 or other components of the robot 1 are positioned. The control box 160 may be formed as a hexahedron or other polyhedron shape, for example.

The control box 160 may be positioned above the battery 110. For example, the control box 160 may be placed on the upper surface of the second horizontal frame 120 and may be received in a space between the second horizontal frame 120 and the third horizontal frame 130, such as in the upper installation space 121.

In certain implementations, the control box 160 can be drawn in or out through the spaces between the pair of front frames 151 and 152. For example, the pair of front frames 151 and 152 may be spaced apart from both side surfaces of the control box 160 by a predetermined distance, thereby forming a space through which the control box 160 can be drawn out of the upper installation space 121. Additionally, the control box 160 may be continuously drawn into the space between the pair of front frames 151 and 152 when the control box 160 is seated on the upper surface of the second horizontal frame 120. For example, the control box 160 may be slid rearward on the second horizontal frame 120.

In addition, the driving unit 100 may further include a stopper (or brace) 170 for adjusting the drawn-in amount of the control box 160. The stopper 170 can be understood as a component which is positioned to contact the control box 160 at a prescribed location to control the drawn-in amount or the drawn-in depth of the control box 160.

The stopper 170 may have a predetermined height from the upper surface of the second horizontal frame 120 and may be in contact with the rear surface of the control box 160. The stopper 170 may be formed so that a portion which is in contact with the control box 160 has a predetermined area so as to increase the contact area with the control box 160.

For example, the stopper 170 may have an L-shape and may include a substantially horizontal fixing portion (or fixing surface) 171 fixed to the upper surface of the second horizontal frame 120 and a substantially vertical contact portion (or contact surface) 172 extending upward from the fixing portion 171. The fixing portion 171 may have a plate shape fixed to the upper surface of the second horizontal frame 120. The fixing portion 171 may be formed with a fastening hole 171a for fastening the second horizontal frame 120 by a fastening member, such as a screw, nail, or rivet.

The contact portion 172 extends substantially upward from one side of the fixing portion 171 to selectively contact the rear side of the control box 160. The contact portion 172 may be formed with a fastening hole 172a to be fastened to the control box 160 by a fastening member. For example, the control box 160 may be drawn into the upper installation space 121 until the contact portion 172 is in contact with a rear surface of the control box 160, and when the control box 160 is in contact with the contact portion 172, the control box 160 can be fixed to the contact portion 172 by fastening a fastening member, such as a nail, screw, adhesive, etc. to the fastening hole 172a or other portion of the contact portion 172.

A front portion of the control box 160 may be coupled to the pair of front frames 151 and 152. For example, a flange portion extending from the front surface of the control box 160 to one or both sides of the control box 160 may be fastened to the pair of front frames 151 and 152 by a fastening member, so that the front surface of the control box 160 may be fixed to the front frames 151 and 152.

For example, when the control box 160 is completely drawn into the upper installation space 121 to contact the stopper 170, the rear surface of the control box 160 can be fixed by the stopper 170 and the front surface of the control box 160 may be fixed by the front frames 151 and 152. Therefore, the control box 160 can be easily drawn into the upper installation space 121, and the control box 160 can be firmly fixed in the upper installation space 121 without vibrating to protect the electronic components stored therein from damage.

In addition, the driving unit 100 further includes a cover portion (or cover) 180. The cover portion 180 may function to protect internal components of the driving unit 100 and to block noise generated in the driving unit 100, such as by the control box 160 or the driving motor 118, from exiting via front a opening. A portion of the cover portion 180 may be partially coupled, for example, to at least one of the first vertical frame 140 or the second vertical frame 150 or another component of the robot 1.

The cover portion 180 may include a front cover 181 provided at the front of the driving unit 100 and side covers 182 and 183 provided at sides thereof. The front cover 181 may be positioned at the front side of the driving unit 100 (e.g., closer to the front frames 151 and 152 than to the rear frames 153 and 154) to shield the front surfaces of the battery 111 and the control box 160. For example, the front cover 181 may shield an entire surface of upper installation space 121 and the lower installation space.

A portion of the front cover 181 may be coupled to at least one of the first vertical frames 140 and the other portion thereof may be coupled to at least one of the second vertical frames 150. For example, on both lateral sides of the front cover 181, a first fastening hole 181a may be formed and may be fastened to a corresponding one of the first vertical frame 140 by a fastening member. Thus, the front cover 181 may be fastened to the first vertical frame 140 and fixed thereto via the first fastening hole 181a.

In another example, side portions of the front cover 181 may include a second fastening hole 181b, and the front cover 181 may be fastened to the second vertical frame 150 by a fastening member passing through the second fastening hole 181b. Thus, the front cover 181 may be fastened to the second vertical frame 150 and fixed thereto via the second fastening hole 181b.

Alternatively, on both side portions of the front cover 181, both the first and second fastening holes 181a and 181b may be formed, a portion of the front cover 181 may be coupled to the first vertical frame 140, and another portion thereof may be coupled to the second vertical frame 150. In this configuration, since the front cover 181 is fastened to both the first vertical frame 140 and the second vertical frame 150 to be more firmly fixed. For example, the first fastening hole 181a may be formed on the lower portion of both side portions of the front cover 181, and the second fastening hole 181b may be formed on the upper portion of both side portions of the front cover 181. In one example, the second fastening hole 181b is formed at a position higher than the first fastening hole 181a.

The side covers 182 and 183 may be positioned on sides of the driving unit 100 to shield side surfaces of the battery 111 and the control box 160. For example, the side covers 182 and 183 may shield sides of the upper installation space 121 and the lower installation space (e.g., a space provided between the first horizontal frame 110 and the second horizontal frame 120). A portion of the side covers 182 and 183 may be coupled to the first vertical frame 140 and the other portion thereof may be coupled to the second vertical frame 150.

In one configuration, the side covers 182, 183 may include a first side cover 182 and a second side cover 183 positioned vertically higher than a portion of the first side cover 182. The first side cover 182 may cover a side surface of the battery 111, and the second side cover 183 may cover a side surface of the control box 160. Thus, the second side cover 183 may be positioned higher than the first side cover 182. In one configuration, the first side cover 182 and the second side cover 183 may be integrally formed.

Fastening holes 182a may be formed on both sides of the first side cover 182 to fasten to the first vertical frame 140 by a fastening member. The first side cover 182 may be fastened to the first vertical frame 140 and fixed thereto.

In addition, fastening holes 183a to be fastened to the second vertical frame 150 by fastening members may be formed on both side portions of the second side cover 183. The second side cover 183 may be fastened to the second vertical frame 140 and fixed thereto.

Although not illustrated, the first side cover 182 and the second side cover 183 may bend and extend to cover both a portion of a side of the driving unit 100 and a portion of the rear thereof. For example, the inside of the driving unit 100 may be covered by the front cover 181, the first side cover 182, and the second side cover 183.

In addition, the driving unit 100 further includes a plurality of wheels 116 and 117. The plurality of wheels 116 and 117 may include a main wheel (or driving wheel) 116 connected to a driving motor 118 to be described later and capable of rotating in accordance with a driving force of the motor 118, and an auxiliary wheel (also referred to as a caster or driven while) 117 which rotates based on the movement of the main wheel 116 or based on an application of an external force to the robot 1, without being connected to a separate driving device, such as the driving motor 118, to receive a driving force.

A pair of main wheels 116 may be positioned on respective sides of the first horizontal frame 110. A plurality of auxiliary wheels 117 may be mounted on a lower side of the first horizontal frame 110.

In addition, the driving unit 100 may further include a driving motor 118. The driving motor 118 may be powered by the battery 111 to generate a driving force. The generated driving force may be selectively provided to the main wheel 116 to cause the main wheel 116 to roll. The driving motor 118 may be provided on one or both sides of the battery 111 and may be connected to the main wheel 116 to transmit the generated driving force.

For example, the driving motor 118 may extend vertically for a predetermined height, and an upper portion thereof may pass through a portion of the second horizontal frame 120. For example, the upper portion of the driving motor 118 may extend vertically to a height corresponding to the upper installation space 121 and may be positioned on the side of the control box 160.

Figure 8:
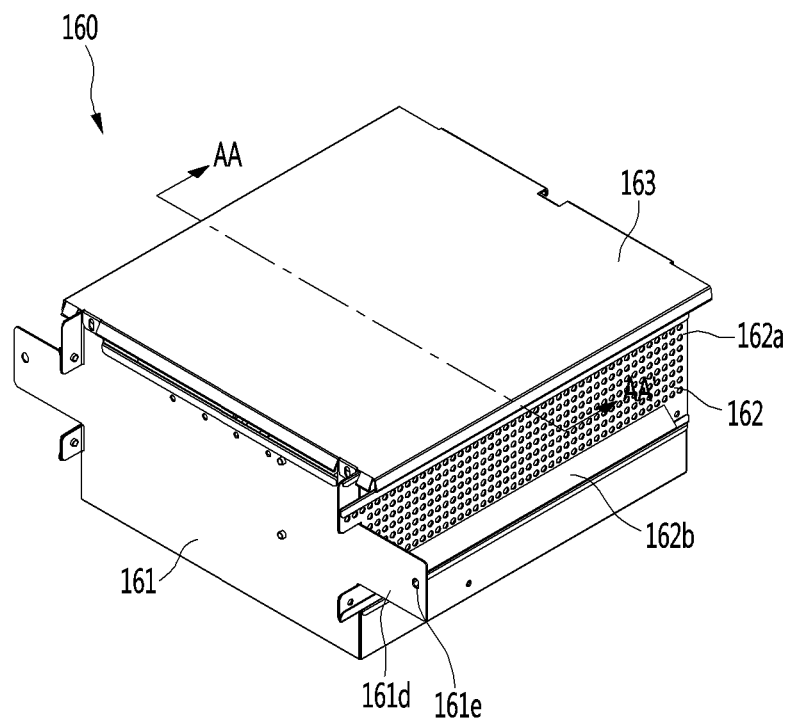
FIG. 8 is a perspective view illustrating a control box according to an embodiment of the present description.
Figure 9:
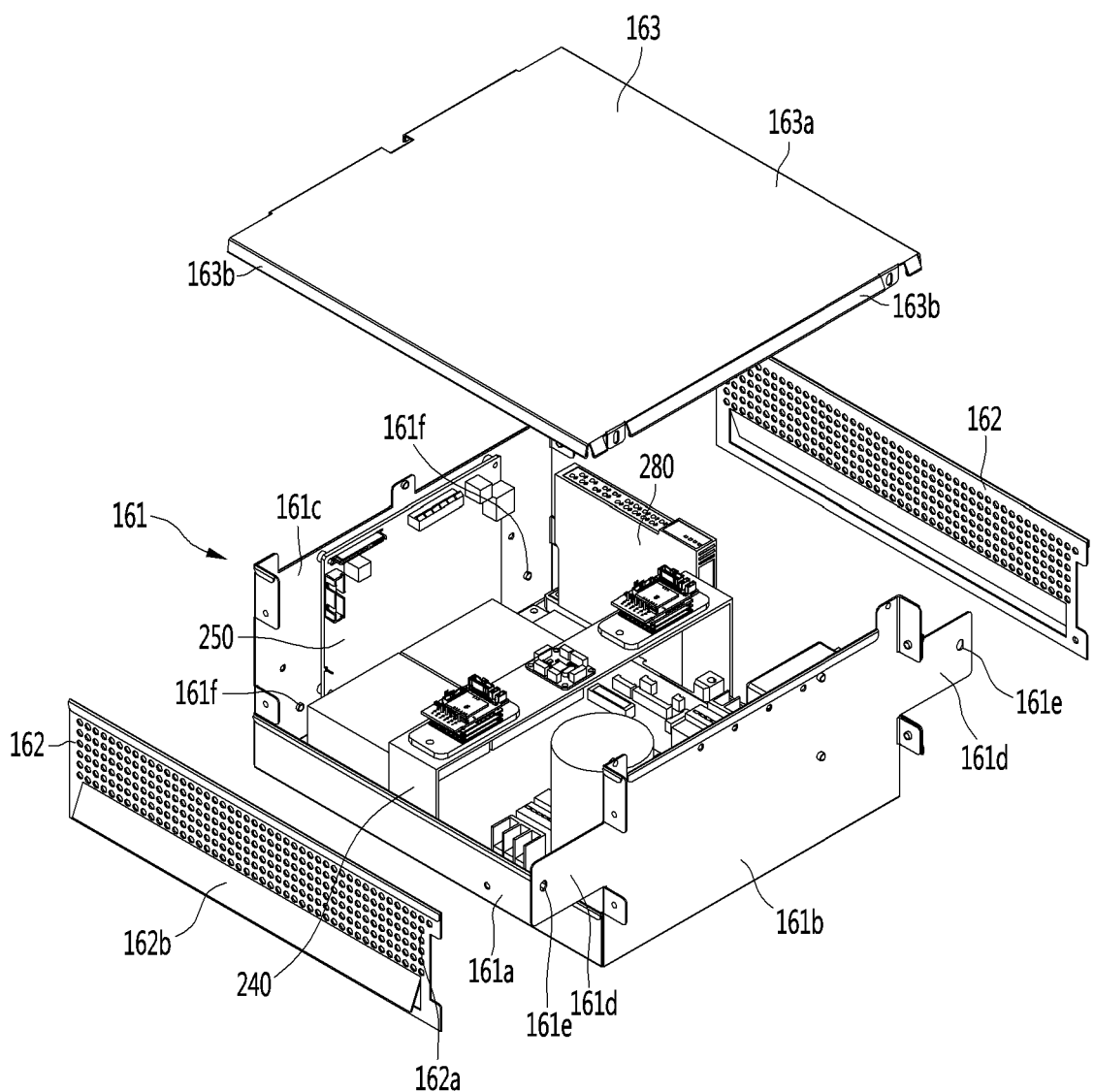
FIG. 9 is an exploded perspective view illustrating a control box according to an embodiment of the present description.
Figure 10:
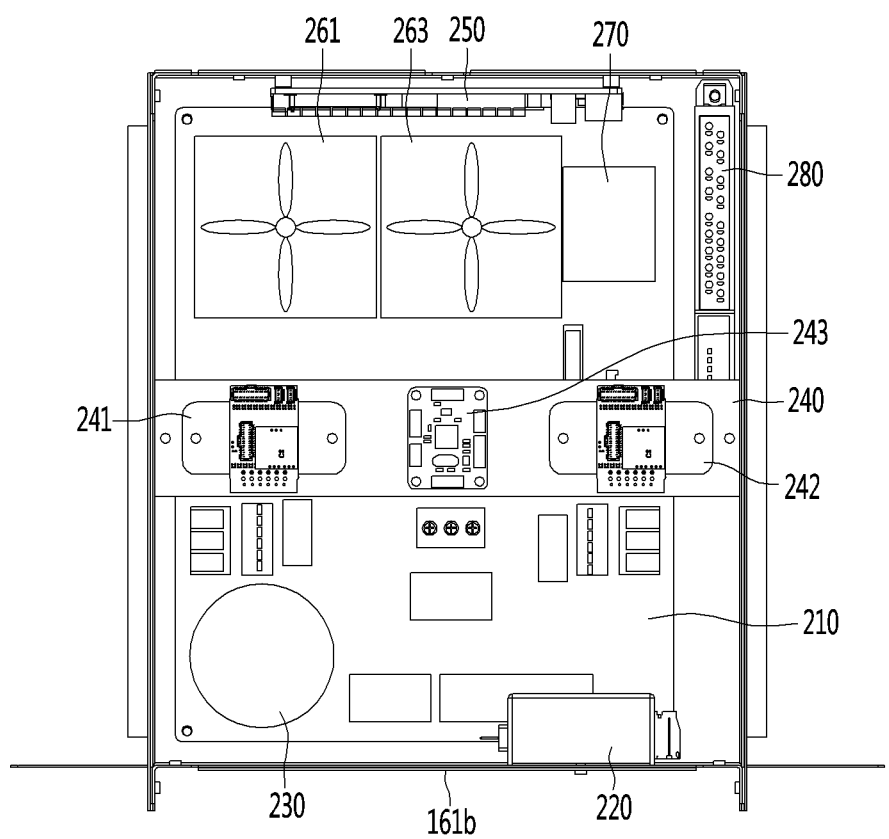
FIG. 10 is a plan view illustrating internal components of a control box according to an embodiment of the present description.
Figure 11:
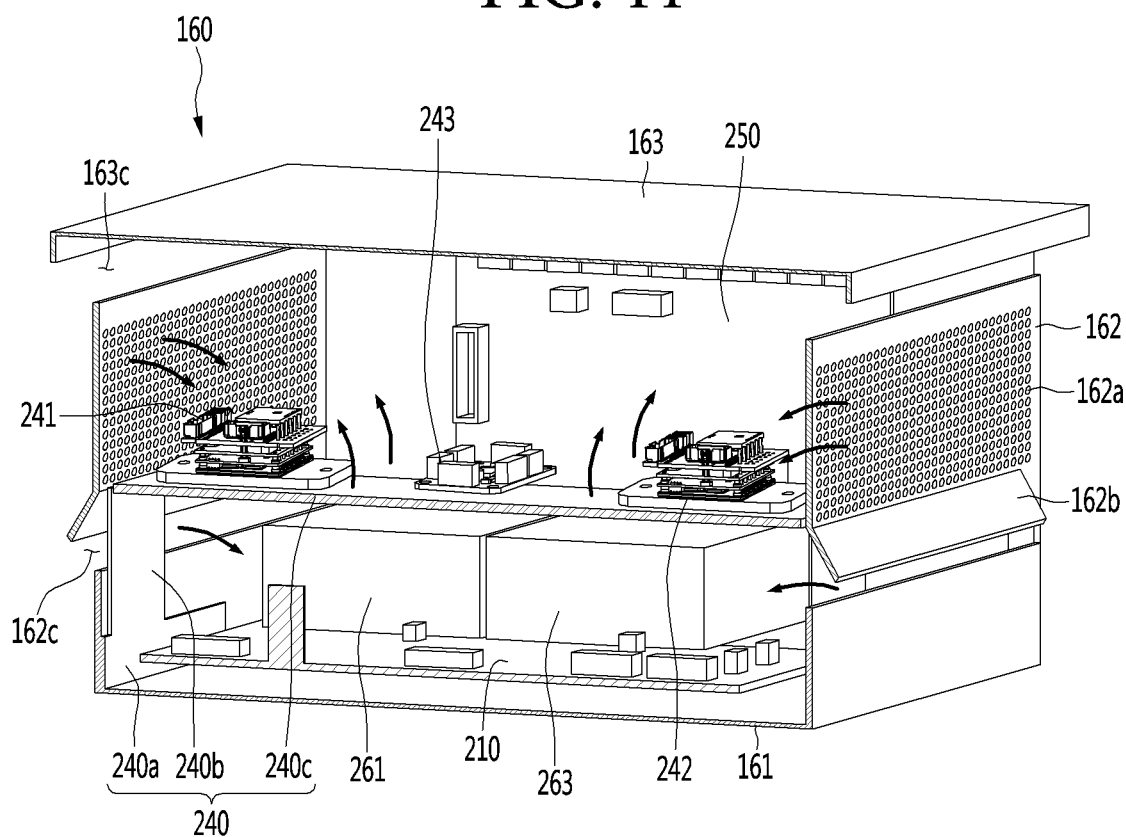
FIG. 11 is a sectional perspective view taken along line AA-AA' of FIG. 8.

Hereinafter, the control box 160 will be described in detail with reference to the drawings. FIG. 8 is a perspective view illustrating a control box 160 according to an embodiment, FIG. 9 is an exploded perspective view illustrating a control box 160 according to an embodiment, FIG. 10 is a plan view illustrating internal components of a control box according to an embodiment of the present description, and FIG. 11 is a sectional perspective view taken along line AA-AA' of FIG. 8.

Referring to FIGS. 8 to 11, the control box 160 may include a plurality of panels. The plurality of panels may be coupled to form in an overall rectangular box or cube shape to define a space in which a plurality of components may be received. The plurality of panels may include a main body panel 161 forming a receiving space in which a plurality of electronic components are received, a pair of side panels 162 coupled to lateral side edges of the main body panel 161, and an upper panel 163 coupled to the upper edge of the main body panel 161.

The main body panel 161 may include a base 161a forming a bottom surface, a front panel 161b extending upward from the front end portion of the base 161a, and a rear panel 161c extending upward from the rear end portion of the base 161a. For example, the base 161a may be formed as a rectangular plate, and the front panel 161b and the rear panel 161c may extend from the front and rear ends of the base 161a, respectively. In this example, the main body panel 161 may have a shape in which both sides and upper surfaces are opened.

In addition, the main body panel 161 further includes a fastening portion (or fastening extension) 161d for selectively fixing or separating the control box 160 to a front of the driving unit 100. For example, the fastening portion 161d may be formed by extending a portion of the front panel 161b outwardly to one or more sides. For example, the fastening portion 161d may be formed such that a portion of opposite side portions of the front panel 161b may be extended laterally. In this example, the fastening portion 161d may be formed of two parts laterally extending from the front panel 161b to opposite sides.

The fastening portion 161d may be formed with fastening holes 161e for fastening to the pair of front frames 151 and 152. For example, fastening members may be positioned through the fastening holes 161e in the fastening portion 161d to couple the fastening portion 161d to the front frames 151 and 152. Alternatively, the fastening portion 161d may be formed by extending a portion of the side panel 162 outwardly such that the fastening portion 161d is not included in the front panel 161b.

In addition, the main body panel 161 may further include a fastening hole 161f for fixing and separating the control box 160 to the rear of the driving unit 100. For example, the fastening hole 161f may be formed through a point of the rear panel 161c. The fastening hole 161f may be formed at a position corresponding to the fastening hole 172a of the contact portion 172 so that the main body panel 161 (e.g., the rear panel 161c) can be fastened by the contact portion 172 by a fastening member.

According to this configuration, when the control box 160 is completely drawn into the upper installation space 121, the contact portion 172 and the rear panel 161c can be fixed by one or more fastening members through rear fastening holes 161f, and the front frames 151 and 152 and the front panel 161b may be fixed by one or more fastening members through front fastening holes 161e. Therefore, the control box 160 can be easily drawn into the upper installation space 121, and the control box 160 can be firmly fixed in the upper installation space 121 without shaking.

The side panel 162 may have a substantially plate shape in which a plurality of heat radiating holes 162a are formed. A pair of side panels 162 may be coupled to respective sides of the body panel 161.

The side panel 162 may further include a cutout portion 162b. The cutout portion 162b may be provided such that a portion of the side panel 162 is cut, and then is inclined to the outside of the side panel 162. For example, the opening 162c may be formed in the side panel 162 by the cutout portion 162b. In addition, air may pass through the opening 162c into the control box 160 to provide circulation. Additionally or alternatively, the opening 162c may be used as a path for drawing out an electric wire (not illustrated) connected to the electronic component provided in the control box 160 to the outside.

The upper panel 163 is coupled to an upper portion of the main body panel 161 to shield the opened upper portion of the main body panel 161. The upper panel 163 may function to help prevent water or other contaminants from infiltrating into the control box 160 from above.

To this end, the upper panel 163 may be formed with a gradient formed in a stepped manner so as to drain the water in a particular direction. For example, the upper panel 163 may include a plate (or horizontal surface) 163a formed horizontally and an edge portion (or edge extension) 163b extending downward from the edge of the plate 163a. Here, the edge portion 163b may extend obliquely downward from the edge of the plate 163a toward the outside. Accordingly, the water falling on the upper surface of the upper panel 163 (e.g., on the plate 163a) may be caught and guided by the edge portion 163b so as to be drained in a predetermined direction away from the control box 160.

A plurality of components 200 may be positioned in the control box 160. The plurality of components 200 may include, for example, a power printed circuit board (PCB) 210. The power PCB 210 may have a predetermined area and may be formed to extend horizontally. The power PCB 210 may be seated on an upper surface of the base 161a.

In addition, the plurality of components 200 further include a line filter 220. The line filter 220 can be understood as a filter for eliminating noise (noise or interference waves) generated in an electronic component provided inside the control box 160. For example, the line filter may include a capacitor positioned at an input/output current. The line filter 220 may be positioned in front of the power PCB 210 (e.g., the line filter 220 is positioned further than the power PCB 210 from the rear frames 153 and 154). Alternatively, the line filter 220 may be installed on the inner surface of the front panel 161b.

The plurality of components 200 further include a direct current (DC)-DC converter 230. For example, the DC-DC converter 230 may be an electric circuit to convert direct current from one voltage level to another voltage level. For example, the DC-DC converter 230 may be a transformer or amplifier circuit. The DC-DC converter 230 may be positioned in front of the power PCB 210. Furthermore, the DC converter 230 may be positioned on the side of the line filter 220.

Further, the plurality of components 200 may further include a bridge 240. The bridge 240 provides an installation surface on which the various components 241, 242, and 243, to be described later, may be installed. The bridge 240 may be a structure installed on the main body panel 161 and may provide a surface on which the electronic components are installed. For example, the bridge 240 may be extend in the traverse direction (e.g., between sides panels 162) with respect to the center of the upper surface of the base 161a.

In one example, the bridge 240 may include first portions (or first bridge surface) 240a fixed to respective sides of the base 161a, second portions (or second bridge surface) 240b extending upward from respective first portions 240a, and third portion (or third) bridge surface 240c connecting the upper-end of the second portions 240b to each other. The first portion 240a may be fixed to the inside of the base 161a to support the bridge 240, and the second portion 240b may extend upwardly from a portion of the first portion 240a to provide a height relative to the bridge 240. In example, the first portion 240a and the second portion 240b may be integrally formed in a single wall. The third portion 240c may form an installation surface on which a plurality of components may be substantially placed or positioned. In one example, the third portion 240c may have a rectangular plate shape.

In one example, the second portion 240b may extend to a position corresponding to half height with respect to the entire height of the control box 160. In this example, the components installed in the third portion 240c may be positioned on the substantially horizontal plane bisecting the inside of the control box 160 in the vertical direction. In addition, space through which indoor air passes (e.g., via cutout portions 162b of the side panel 162) may be provided in a space corresponding to a lower side of the third portion 240c.

In addition, the plurality of components 200 may further include a pair of motor drivers 241 and 242. The pair of motor drivers 241 and 242 can be understood as a configuration for controlling the driving of a pair of driving motors 118 (e.g., a left and right driving motors 118). The pair of motor drivers 241 and 242 may be installed in the bridge 240. For example, the pair of motor drivers 241 and 242 may be spaced apart from each other on the upper surface of the bridge 240, such as to be positioned on sides of the upper surface of the third portion 240c.

In addition, the plurality of components 200 further include an inertial measurement unit (or inertial sensor) 243. The inertial measurement unit 243 may be circuitry for measuring the movement amount, the rotation amount, and the inertia of the guide robot 1. The inertial measurement unit 243 may include, for example, an acceleration sensor and a gyroscope sensor.

The inertial measurement unit 243 may be installed on the upper surface of the bridge 240. In one example, the inertial measurement unit 243 may be positioned in the third portion 240c of the bridge 240. The inertial measurement unit 243 may be positioned between the pair of motor drivers 241 and 242.

The inertial measurement unit 243 may be positioned at the center point of the guide robot 1 so as to accurately detect the amount of rotation of the head unit 40 or the driving unit 100 of the guide robot 1. For example, the inertial measurement unit 243 needs to be disposed at the center point within the control box 160. To this end, in the present description, a bridge 240 on which the inertial measurement unit 243 is installed is disposed at the center of the control box 160 in the transverse direction.

In addition, the pair of motor drivers 241 and 242 may be positioned on both sides of the control box 160 so as to facilitate electric wire connections to the pair of driving motors 118. For example, since the pair of driving motors 118 may be positioned adjacent to both sides of the control box 160, the pair of motor drivers 241 and 242 may be connected respectively to the pair of driving motors 118 by a relatively short electric wire.

In addition, the plurality of components 200 may further include a control PCB 250. The control PCB 250 may control the overall operation of the driving unit 100. For example, the control PCB 250 may selectively cause power to be applied to one or more components of driving unit 100, such as the driving motors 118, to control a movement of the robot 1. In one example, the control PCB 250 may be installed on the inner surface of the rear panel 161c.

Further, the plurality of components 200 further include air blowing fans 261 and 263. The air blowing fans 261 and 263 may be configured to forcibly circulate the air inside the control box 160 to cool the plurality of components 200. The air blowing fans 261 and 263 may include a first fan 261 and a second fan 263. The first fan 261 and the second fan 263 may be installed adjacent to the rear of the power PCB 210. In one example, heat generating components (not illustrated) may be provided in the first fan 261 and the second fan 263.

In addition, the plurality of components 200 may further include an electromagnetic interference (EMI) filter 270. The EMI filter 270 is installed behind the power PCB 210. The EMI filter 270 may be positioned on the side of the air blowing fans 261 and 263.

In addition, the plurality of components 200 may further include a relay 280. Relay 280 may be a switch that opens and closes circuits in other components 200. For example, relay 280 may control one electrical circuit by opening and closing contacts in another circuit. The relay 280 may be installed on the inner surface of the side panel 162.

Meanwhile, when the air blowing fans 261 and 263 are rotated, indoor air can be suctioned toward the inside of the control box 160 through the plurality of heat radiating holes 162*a* or the openings 162*c*. The suctioned indoor air circulates in the control box 160 and can perform heat exchange with a plurality of components 200.

In addition, when the air blowing fans 261 and 263 are rotated, indoor air may be suctioned toward the inside of the control box 160 through a gap 163*c* formed between the upper panel 163 and the side panel 162. The suctioned indoor air circulates in the control box 160 and can perform heat exchange with a plurality of components 200.

The robot 1 according to aspects of the present description may have the following attributes. First, since the control box 160, in which a plurality of electronic components 200 may be received, can be slidably moved into the robot 1 and be drawn out, such that that the control box 160 can be separated from and installed in the robot 1.

Second, since the control box 160 can be drawn in and out through space between neighboring vertical frames 151, 152 and a portion of the control box can be fastened to the vertical frames 151, 152, the draw-in direction of the control box can be guided and the control box can be fixed firmly.

Third, since the horizontal frame 120 on which the control box 160 is seated may be provided with a stopper 170 which is in contact with the rear surface of the control box 160, it is possible to adjust the draw-in amount of the control box 160, thereby preventing the control box 160 from being broken due to excessive motion and preventing the control box 160 from being detached toward a rear of the driving unit 100.

Fourth, since a bridge 240 for separating some of the electronic components 200 from the upper surface of the base surface 161 may be provided inside the control box 160, the installation area where the electronic components 200 are installed may be greatly increased, and the internal space of the control box 160 can be efficiently used.

Fifth, since an air blowing fan 261, 263 for air circulation may be installed inside the control box 160, and a heat generating element may be provided inside the air blowing fan, heat generated by the heat generating element can be cooled by the air blowing fan 161, 163.

Aspects of the present description provide a guide robot which can be easily installed inside a robot and can be easily drawn out. Another aspect of the present description provides a robot 1 in which the control box 160 is prevented from being damaged and the control box 160 can be stably supported when installed inside the robot 1. Another aspect of the present description provides a guide robot 1 which can effectively increase the area in which electronic components 200 are installed by efficiently utilizing the internal space of the control box 160. Another objective of the present description provides a robot 1 in which cooling of a heating element installed inside a control box 160 can be performed quickly.

A robot according to an embodiment of the present description includes a first horizontal frame, a second horizontal frame which is spaced above the first horizontal frame and on which the control box is seated, a third horizontal frame which is spaced above the second horizontal frame, and a plurality of vertical frames which are spaced apart from each other on the upper surface of the second horizontal frame and which connects the second horizontal frame and the third horizontal frame.

The control box can be drawn out to the inside of the second horizontal frame through between two neighboring vertical frames, so that the control box can be easily drawn in and the control box can be easily separated. The plurality of vertical frames include a pair of front frames spaced apart from each other at a front edge of the second horizontal frame and a pair of rear frames spaced from each other at a rear edge of the second horizontal frame.

The spacing distance between the pair of front frames may be larger than the spacing distance between the pair of rear frames, and since the control box is drawn out inside the second horizontal frame through a space between the pair of front frames, a draw-in direction of the control box can be guided and the control box can be prevented from being detached backward. A portion of the control box can be fastened to the pair of front frames by a fastening member. Further, since the front cover coupled to the pair of front frames and shielding the front surface of the control box is further provided, the control box can be stably fixed without being detached to the outside.

In addition, the robot may further include a stopper formed on an upper surface of the second horizontal frame and being in contact with the outer surface of the control box when the control box is drawn in. The stopper may include a fixing portion fixed to the upper surface of the second horizontal frame and a contact portion extending upward from the fixing portion and being in contact with the rear surface of the control box. Since the fastening hole for fastening the rear surface of the control box by the fastening member is formed on the contact portion, the control box can be firmly fixed without being further drawn in backward.

The control box can include a main body panel forming a receiving space in which a plurality of components are received, a side panel coupled to both sides of the main body panel, and a fastening portion further extending outwardly from either the main body panel or the side panel and being fastened to the front frame. The main body panel may include a base forming a bottom surface, a front panel extending upward from a front end portion of the base, and a rear panel extending upward from a rear end portion of the base, and in the fastening portion, both side portions of the front panel may be formed to extend laterally.

In addition, the control box may further include a bridge formed to extend upward from an upper surface of the base to separate the electronic component from the upper surface of the base. The bridge may include first portion fixed to both sides of the base, respectively, second portion extending upward from the first portion, respectively, and third portion connecting each of end portion of the second portion and providing a surface in which the electronic components are installed, and thus the internal space of the control box can be utilized efficiently. For example, the bridge may be disposed long in a transverse direction with respect to the center of the upper surface of the base. The inertia measurement sensor may be positioned at the center of the upper surface of the third portion, and the accuracy of the sensor can be improved.

In addition, the motor may include a pair of motors respectively positioned on sides of the control box, and an upper surface of the third portion corresponding to both sides of the inertia measurement sensor may be provided with a pair of motor drivers which is electrically connected to the pair of motors. Further, the robot may further include an air blowing fan installed in the base, in which the heat generating element is provided in the air blowing fan, so that the heat generated by the heat generating element can be easily cooled by the air blowing fan.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A robot comprising:
   a first plate that is coupled to a wheel that rotates to drive the robot based on a received force;
   a second plate that is vertically spaced from the first plate;
   a third plate that is vertically spaced from the second plate, an installation space being defined between the second plate and the third plate;
   an inner housing having a receiving space to receive one or more components; and
   a plurality of posts that are spaced apart from each other on an upper surface of the second plate and connect the second plate and the third plate,
   wherein the inner housing is slidably positioned in the installation space to be drawn out between two of the posts, wherein the plurality of posts includes:
a pair of front posts which are spaced apart from each other at a front edge of the second plate; and
a pair of rear posts which are spaced apart from each other at a rear edge of the second plate, and
wherein the robot further comprises a bracket which is provided on the upper surface of the second plate and is positioned to contact with an outer surface of the inner housing when the inner housing is drawn into the installation space.

2. The robot of claim 1, wherein the posts are first posts, and the robot further comprises:
a plurality of second posts that are spaced apart from each other on an upper surface of the first plate and connect the first plate and the second plate.

3. The robot of claim 1, wherein a battery is positioned between the first plate and the second plate.

4. The robot of claim 1, wherein the bracket includes:
a fixing surface which is fixed to the upper surface of the second plate; and
a contact surface which vertically extends upward from the fixing surface and contacts the outer surface of the inner housing when the inner housing is drawn into the installation space.

5. The robot of claim 4, wherein the contact surface includes a fastening hole, and a fastener is inserted through the fastening hole to be coupled to the outer surface of the inner housing.

6. The robot of claim 1,
wherein a spacing distance between the pair of front posts is greater than a spacing distance between the pair of rear posts.

7. The robot of claim 6, wherein the inner housing is drawn out of the installation space between the pair of front posts.

8. The robot of claim 7, wherein the inner housing is selectively fastened to one or more of the pair of front posts.

9. The robot of claim 7, further comprising:
a front cover which is coupled to the pair of front posts to shield a front surface of the inner housing.

10. A robot comprising:
a first plate that is coupled to a wheel that rotates to drive the robot based on a received force;
a second plate that is vertically spaced from the first plate;
a third plate that is vertically spaced from the second plate, an installation space being defined between the second plate and the third plate;
an inner housing having an receiving space to receive one or more components; and
a plurality of posts that are spaced apart from each other on an upper surface of the second plate and connect the second plate and the third plate,
wherein the inner housing is slidably positioned in the installation space to be drawn out between two of the posts,
wherein the plurality of posts includes:
a pair of front posts which are spaced apart from each other at a front edge of the second plate; and
a pair of rear posts which are spaced apart from each other at a rear edge of the second plate,
wherein the inner housing includes:
a main body panel which forms the receiving space in which the one or more components are received;
side panels which are coupled to lateral sides of the main body panel; and
a fastening extension that extends outward from at least one of the main body panel or one of the side panels and is fastened to the one or more of the front posts.

11. The robot of claim 10, wherein each of the side panels include
a first surface that includes a plurality of holes, and
a second surface provided below the holes and that extends laterally from the first surface to define a horizontal slot.

12. The robot of claim 10, wherein the inner housing includes:
an upper panel that is positioned over the main body panel and the side panels, the upper panel including a horizontal plate and one or more edge extensions that extend vertically downward from respective edges of the horizontal plate to cover at least a portion of the side panels.

13. The robot of claim 10,
wherein the main body panel includes
a base that defines a bottom surface;
a front panel that extends upward from a front end portion of the base; and
a rear panel that extends upwardly from a rear end portion of the base, and
wherein the fastening extension is formed at side portions of the front panel.

14. The robot of claim 13, further comprising:
a fan positioned on the base,
wherein one of the components generates heat and is positioned in the fan.

15. The robot of claim 13, wherein the one or more components received in the inner housing includes one or more first components and one or more second components, and
wherein the inner housing further includes:
a bridge that extends vertically from an upper surface of the base such that a section of the bridge is spaced apart from the upper surface of the base, the one or more first components being positioned on the upper surface of the base, and the one or more second components being positioned on the bridge and being vertically spaced from the one or more first components.

16. The robot of claim 15, wherein the bridge includes:
first plates that are fixed to respective sides of the base;
second plates that extend upwardly from the first plates, respectively; and
a third plate which extend between end portions of the second plates and provide a surface on which the first component is installed.

17. The robot of claim 15, wherein the bridge is positioned to extend in a transverse direction with respect to a center of the upper surface of the base.

18. The robot of claim 17, wherein the one or more second components includes an inertial sensor positioned at a center of an upper surface of the third plate.

19. The robot of claim 18,
wherein the one or more first components include a pair of motors positioned at respective sides of the inner housing, and
wherein the one or more second components further includes a pair of motor drivers positioned on an upper surface of the third plate and at respective sides of the inertial sensor.

* * * * *